United States Patent
Chen et al.

(10) Patent No.: US 6,716,676 B2
(45) Date of Patent: Apr. 6, 2004

(54) THERMALLY-ENHANCED STACKED-DIE BALL GRID ARRAY SEMICONDUCTOR PACKAGE AND METHOD OF FABRICATING THE SAME

(75) Inventors: Eing-Chieh Chen, Taichung (TW); Cheng-Yuan Lai, Taichung (TW); Tzu-Yi Tien, Taichung (TW)

(73) Assignee: Siliconware Precision Industries Co., Ltd. (TW)

( * ) Notice: Subject to any disclaimer, the term of this patent is extended or adjusted under 35 U.S.C. 154(b) by 0 days.

(21) Appl. No.: 10/251,171

(22) Filed: Sep. 19, 2002

(65) Prior Publication Data

US 2003/0020151 A1 Jan. 30, 2003

Related U.S. Application Data

(62) Division of application No. 09/905,499, filed on Jul. 14, 2001, now Pat. No. 6,472,741.

(30) Foreign Application Priority Data

Jun. 4, 2001 (TW) ........................................ 90113447 A

(51) Int. Cl.[7] ............................................... H01L 21/44
(52) U.S. Cl. ........................ 438/122; 438/125; 438/128
(58) Field of Search ................................ 438/122, 125, 438/123, 124, 127, 128, 106, 108, 112; 257/720, 712, 705, 706, 686, 779, 783, 786, 659, 713, 778, 700

(56) References Cited

U.S. PATENT DOCUMENTS

| | | | | |
|---|---|---|---|---|
| 5,293,301 A | * | 3/1994 | Tanaka et al. | 361/707 |
| 5,644,163 A | * | 7/1997 | Tsuji | 257/706 |
| 5,726,079 A | | 3/1998 | Johnson | |
| 5,815,372 A | | 9/1998 | Gallas | |
| 5,866,943 A | * | 2/1999 | Mertol | 257/712 |
| 5,909,057 A | | 6/1999 | McCormick et al. | |
| 6,143,590 A | * | 11/2000 | Ohki et al. | 438/122 |
| 6,359,341 B1 | * | 3/2002 | Huang et al. | 257/778 |
| 6,388,340 B2 | * | 5/2002 | Distefano | 257/787 |
| 6,472,741 B1 | * | 10/2002 | Chen et al. | 257/712 |
| 6,501,164 B1 | * | 12/2002 | Chen et al. | 257/686 |

* cited by examiner

*Primary Examiner*—Carl Whitehead, Jr.
*Assistant Examiner*—Laura M Schillinger
(74) *Attorney, Agent, or Firm*—Peter F. Corless; Steven M. Jensen; Edwards & Angell, LLP

(57) ABSTRACT

A new semiconductor packaging technology is proposed for the fabrication of a thermally-enhanced stacked-die BGA (Ball Grid Array) semiconductor package. By the proposed semiconductor packaging technology, a substrate is used as a chip carrier for the mounting of two semiconductor chips in conjunction with a heat spreader thereon, wherein the first semiconductor chip is mounted over the substrate through flip-chip (FC) technology; the heat spreader is mounted over the first semiconductor chip and supported on the substrate; and the second semiconductor chip is mounted on the heat spreader and electrically coupled to the substrate through wire-bonding (WB) technology. To facilitate the wire-bonding process, the heat spreader is formed with a plurality of wire-routing openings to allow the bonding wires to be routed therethrough. Since chip-produced heat during operation can be dissipated through the heat spreader, it allows an enhanced heat-dissipation efficiency. In addition, the heat spreader can serve as a grounding plane to the package chips, so that the packaged chips would have better electrical performance during operation.

9 Claims, 5 Drawing Sheets

US 6,716,676 B2

THERMALLY-ENHANCED STACKED-DIE BALL GRID ARRAY SEMICONDUCTOR PACKAGE AND METHOD OF FABRICATING THE SAME

This is a division of application Ser. No. 09/905,499 filed Jul. 14, 2001 now U.S. Pat. No. 6,472,741.

BACKGROUND OF THE INVENTION

1. Field of the Invention

This invention relates to semiconductor packaging technology, and more particularly, to a thermally-enhanced stacked-die BGA (Ball Grid Array) semiconductor package and method of fabricating the same.

2. Description of Related Art

Stacked-die semiconductor packaging technology is used to pack two or more semiconductor chips in a stacked manner in one single package unit, so as to allow one single package unit to be capable of offering a doubled level of functionality or data storage capacity (note that the term "semiconductor die" is synonymous to the term "semiconductor chip"). Memory chips, such as flash memory chips, are typically packaged in this way so as to allow one single memory module to offer an increased data storage capacity.

A conventional type of stacked-die semiconductor packaging technology is based on WB-FC-BGA (Wire-Bonded & Flip-Chip Ball Grid Array) architecture to pack a pair of semiconductor chips in a stacked manner over a BGA substrate, which is characterized in that the underlying chip is electrically coupled to the substrate through flip-chip (FC) technology, while the overlying chip is electrically coupled to the same substrate through wire-bonding (WB) technology.

FIG. 1 shows a schematic sectional diagram of a conventional stacked-die BGA package that is based on the WB-FC-BGA architecture. As shown, this stacked-die BGA package includes: (a) a substrate 100 having a front surface 100a and a back surface 100b; (b) a first semiconductor chip 110 having an active surface 110a and an inactive surface 110b, and whose active surface 110a is bonded and electrically coupled to the front surface 100a of the substrate 100 through flip-chip (FC) technology; (c) a second semiconductor chip 120 having an active surface 120a and an inactive surface 120b, and whose inactive surface 120b is adhered by means of an adhesive layer 121 to the inactive surface 110b of the first semiconductor chip 110; (d) a plurality of bonding wires 140, such as gold wires, which are routed from the active surface 120a of the second semiconductor chip 120 down to the front surface 100a of the substrate 100, for electrically coupling the second semiconductor chip 120 to the substrate 100; (e) an encapsulation body 150 for encapsulating the two stacked chips 110, 120 over the substrate 100; and (i) a ball grid array 160 implanted on the back surface 100b of the substrate 100.

One drawback to the forgoing stacked-die BGA package structure, however, is that the two stacked chips 110, 120 would have a poor heat-dissipation capability since no additional heat-dissipation means is provided. This would make the heat produced by the stacked chips 110, 120 during operation to accumulate therebetween Moreover, since the heat produced by the first semiconductor chip 110 would be conducted to the second semiconductor chip 120, it would cause the second semiconductor chip 120 to accumulate more heat that would make the second semiconductor chip 120 more likely damaged due to thermal stress.

FIG. 2 shows a schematic sectional diagram of a thermally-enhanced version of the stacked-die BGA package of FIG. 1. As shown, this stacked-die BGA semiconductor package is substantially identical in structure as that shown in FIG. 1, which also includes: (a) a substrate 200 having a front surface 200a and a back surface 200b; (b) a first semiconductor chip 210 having an active surface 210a and an inactive surface 210b, and whose active surface 210a is electrically coupled to the front surface 200a of the substrate 200 through FC technology, (c) a second semiconductor chip 220 having an active surface 220a and an inactive surface 220b, and whose inactive surface 220b is adhered by means of an adhesive layer 221 to the inactive surface 210b of the first semiconductor chip 210; (d) a plurality of bonding wires 240, which are routed from the active surface 220a of the second semiconductor chip 220 down to the front surface 200a of the substrate 200, for electrically coupling the second semiconductor chip 220 to the substrate 200; (e) an encapsulation body 250 for encapsulating the two stacked chips 210, 220 over the substrate 200; and (f) a ball grid array 260 implanted on the back surface 200b of the substrate 200. To enhance its heat dissipation capability, a heat spreader 230 is mounted over the substrate 200. The heat spreader 230 is substantially U-shaped in cross section having a support portion 231 and an overhead portion 232, with the support portion 231 being supported on the substrate 200 and the overhead portion 232 being positioned above the two stacked chips 210, 220. This allows the heat produced by the two stacked chips 210, 220 to be conducted first to the capsulant between the second semiconductor chip 200 and the heat spreader 230, and onwards through the heat spreader 230 to the outside atmosphere. Therefore, the stacked-die BGA package of FIG. 2 is better in heat-dissipation capability than the prior art of FIG. 1.

The forgoing package structure of FIG. 2, however, has the following drawbacks. First, since the heat spreader 230 is not in direct contact with the inactive surfaces 210b, 220b of the packaged chips 210, 220, it would result in a poor heat-dissipation capability. Second, since there are no grounding plane on the back side of each of the two packaged chips, it would result in a poor grounding effect and thereby a poor electrical performance to the packaged chips, Related patents, include, for example, the U.S. Pat. No. 5,726,079 entitled "THERMALLY ENHANCED FLIP CHIP PACKAGE AND METHOD OF FORMING"; the U.S. Pat. No. 5,909,057 entitled "INTEGRATED HEAT SPREADER/STIFFENER WITH APERTURES FOR SEMICONDUCTOR PACKAGE"; and the U.S. Pat. No. 5,815,372 entitled "PACKAGING MULTIPLE DIES ON A BALL GRID ARRAY SUBSTRATE"; to name just a few.

The U.S. Pat. No. 5,726,079 discloses an advanced semiconductor packaging technology for the fabrication of a FC-BGA package, while the U.S. Pat. No. 5,909,057 discloses another semiconductor packaging technology for the fabrication of a thermally-enhanced FC-BGA package. None of these two patents, however, teach a solution to the above-mentioned problems of the stacked-die BGA package structure depicted in FIG. 1 and FIG. 2.

The U.S. Pat. No. 5,815,372 discloses a semiconductor packaging technology for the fabrication of a stacked-die BGA package based on WB-FC-BGA architecture. One drawback to this patent, however, is that since its architecture is similar to the one depicted in FIG. 1, it nevertheless has the problem of a poor heat-dissipation capability as mentioned above.

SUMMARY OF THE INVENTION

It is therefore an objective of this invention to provide a new stacked-die BGA semiconductor packaging technology that allows the chip-produced heat to be dissipated directly to the outside atmosphere.

It is another objective of this invention to provide a new stacked-die BGA semiconductor packaging technology that can provide a grounding plane to the packaged chips, so as to help enhance the electrical performance of the packaged chips.

In accordance with the foregoing and other objectives, the invention proposes a new semiconductor packaging technology for the fabrication of a stacked-die BGA semiconductor package.

By the semiconductor packaging technology according to the invention, a first semiconductor chip is mounted over a substrate through flip-chip (FC) technology; and then a heat spreader is mounted over the first semiconductor chip. The heat spreader has a support portion and an overhead portion formed with a plurality of wire-routing openings; wherein the heat spreader is mounted in such a manner that the support portion is supported on the front surface of the substrate, while the overhead portion is abutted on the inactive surface of the first semiconductor chip. Next, a second semiconductor chip is mounted over the overhead portion of the heat spreader. After this, a plurality of bonding wires are routed from the active surface of the second semiconductor chip through the wire-routing openings in the overhead portion of the heat spreader down to the front surface of the substrate, for electrically coupling the second semiconductor chip to the substrate.

Compared to the prior art, the invention has the following advantages. First, since the heat spreader is in direct contact with both of the two packaged chips, it allows an increased heat-dissipation capability as compared to the prior art. Second, since the overhead portion of the heat spreader is arranged between the two packaged chips rather than above the overlying chip, it provides a grounding plane to the package chips, so that the packaged chips would have better electrical performance during operation.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

The stacked-die BGA semiconductor packaging technology according to the invention is disclosed in full details by way of several preferred embodiments in the following with reference to the drawings.

First Preferred Embodiment

Figure 3A:
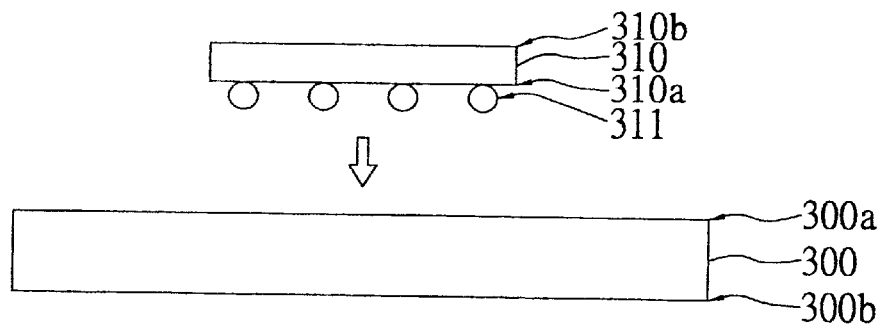
FIGS. 3A–3D are schematic sectional diagrams used to depict a first preferred embodiment of the semiconductor packaging technology according to the invention.

Referring first to FIG. 3A, by the stacked-die BGA semiconductor packaging technology according to the invention, the first step is to prepare a substrate 300 having a front surface 300a and a back surface 300b, wherein the front surface 300a and the back surface 300b are both formed with a plurality of electrical contact points and electrically-conductive traces (not shown) for BGA application.

In the next step, a first semiconductor chip 310 having an active surface 310a and an inactive surface 310b is mounted over the front surface 300a of the substrate 300, in such a manner that its active surface 310a is bonded and electrically coupled to the front surface 300a of the substrate 300 through flip-chip (FC) technology by means of a plurality of solder bumps 311.

Figure 3B:
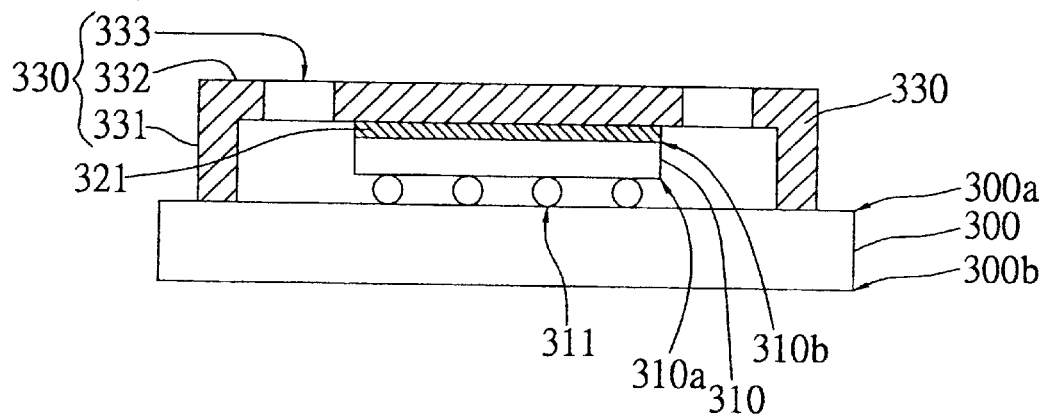
Figure 4:
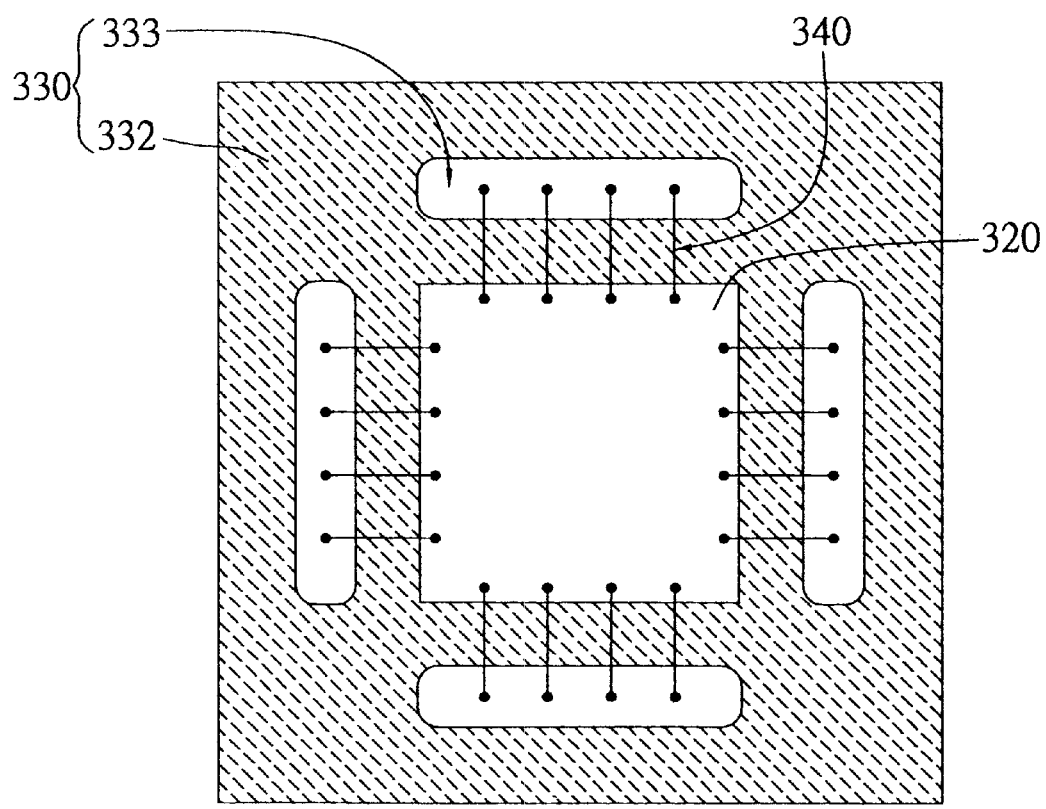
FIG. 4 shows a schematic top view of the heat spreader utilized by the semiconductor package according to the invention.

Referring further to FIG. 3B together with FIG. 4, in the next step, a heat spreader 330 having a support portion 331 and an overhead portion 332 is mounted to the front surface 300a of the substrate 300, in such a manner that its support portion 331 is supported on the front surface 300a of the substrate 300, while its overhead portion 332 is adhered by means of a thermally-and-electrically-conductive layer 321 over the inactive surface 310b of the first semiconductor chip 310. The heat spreader 330 is made of a highly thermally-conductive material, such as copper. As shown in FIG. 4, in order to facilitate subsequent wire-bonding process, the overhead portion 332 of the heat spreader 330 is further formed with a plurality of wire-routing openings 333.

Figure 3C:
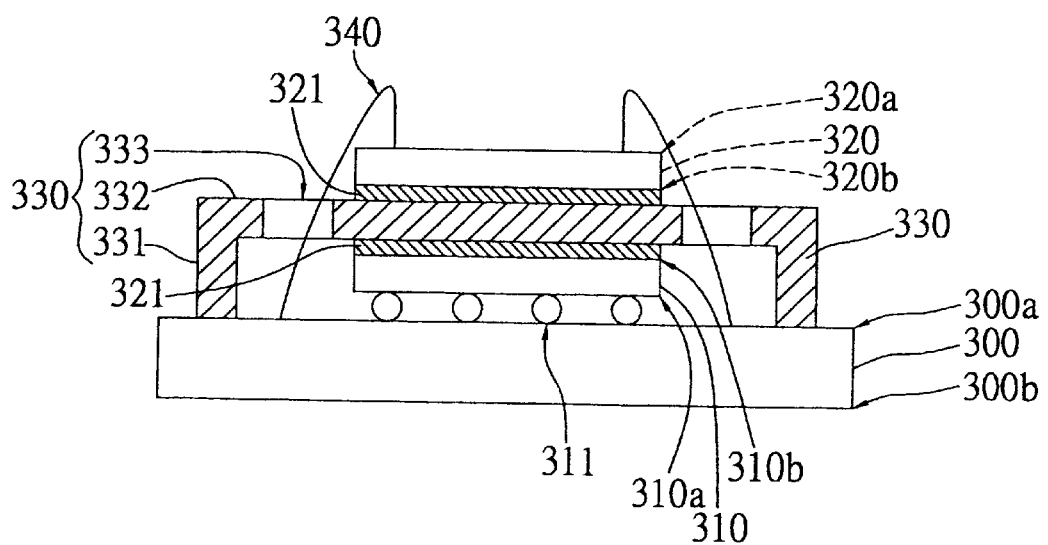

Referring further to FIG. 3C, as the heat spreader 330 is mounted in position, the next step is to mount a second semiconductor chip 320 over the overhead portion 332 of the heat spreader 330 by adhering its inactive surface 320b by means of a thermally-and-electrically-conductive layer 321 over the overhead portion 332. Subsequently, a wire-bonding process is performed to electrically couple the second semiconductor chip 320 to the substrate 300 by means of a plurality of bonding wires 340, such as gold wires, wherein the bonding wires 340 are routed from the active surface 320a through the wire-routing openings 333 in the overhead portion 332 of the beat spreader 330 down to the front surface 300a of the substrate 300.

Figure 3D:
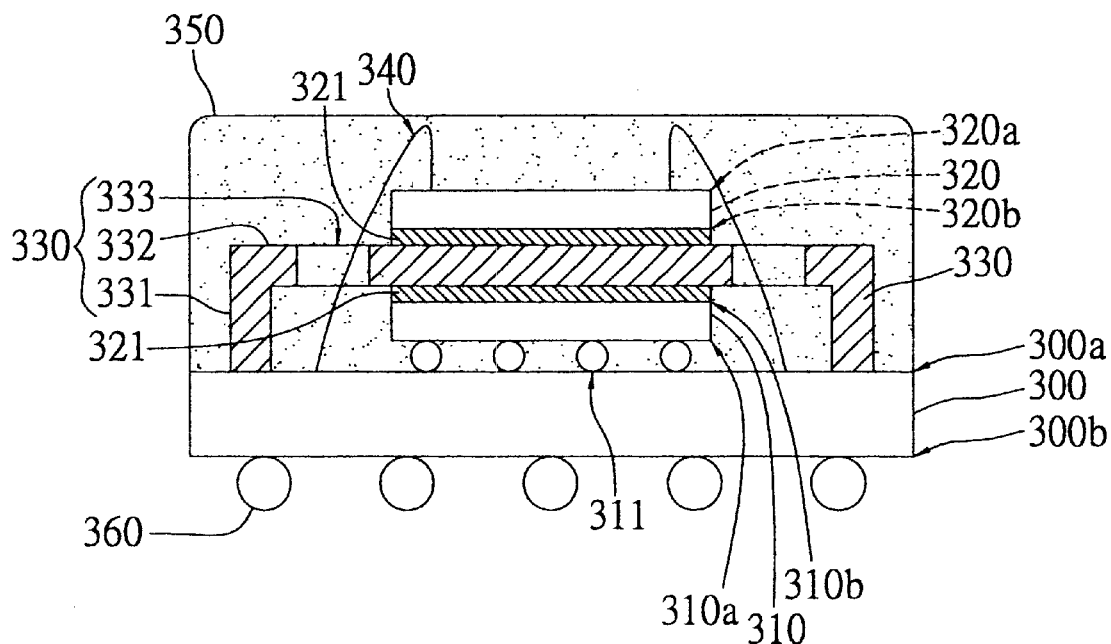

Referring further to FIG. 3D, in the next step, an encapsulation process is performed to form an encapsulation body 350 to encapsulate the two semiconductor chips 310, 320, the front side 300a of the substrate 300, the heat spreader 330, and the bonding wires 340. After this, a ball grid array 360 is implanted over the back surface 300b of the substrate 300. This completes the packaging process.

Second Preferred Embodiment

Figure 5:
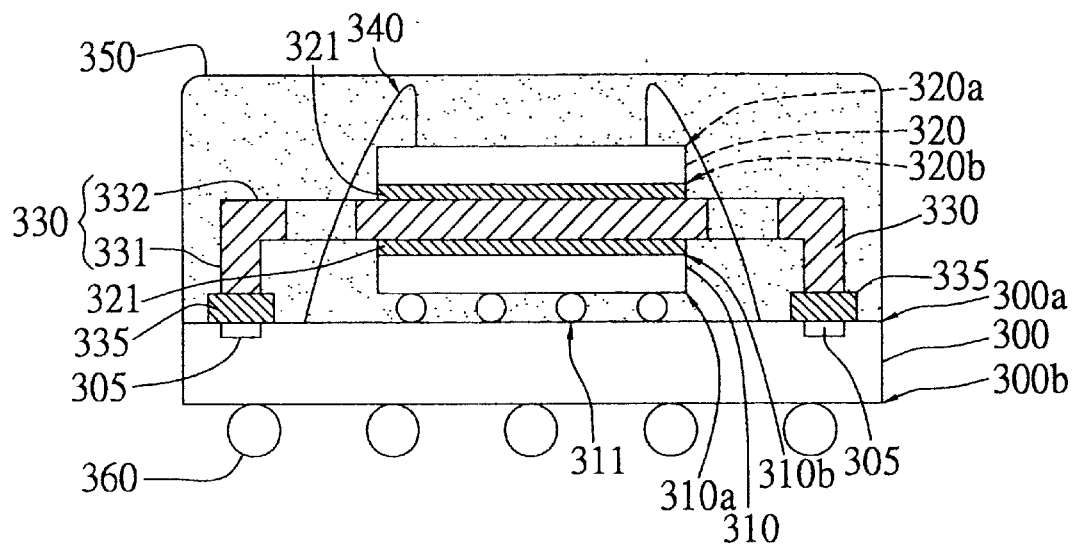
FIG. 5 is a schematic sectional diagram showing a second preferred embodiment of the semiconductor packaging technology according to the invention.

FIG. 5 shows a second preferred embodiment of the semiconductor packaging technology according to the invention. In this embodiment, the support portion 331 of the heat spreader 330 is adhered by means of an electrically-conductive layer 335 to the grounding point 305 on the front surface 300a of the substrate 300. This allows an enhanced grounding effect to the heat spreader 330.

Third Preferred Embodiment

Figure 6:
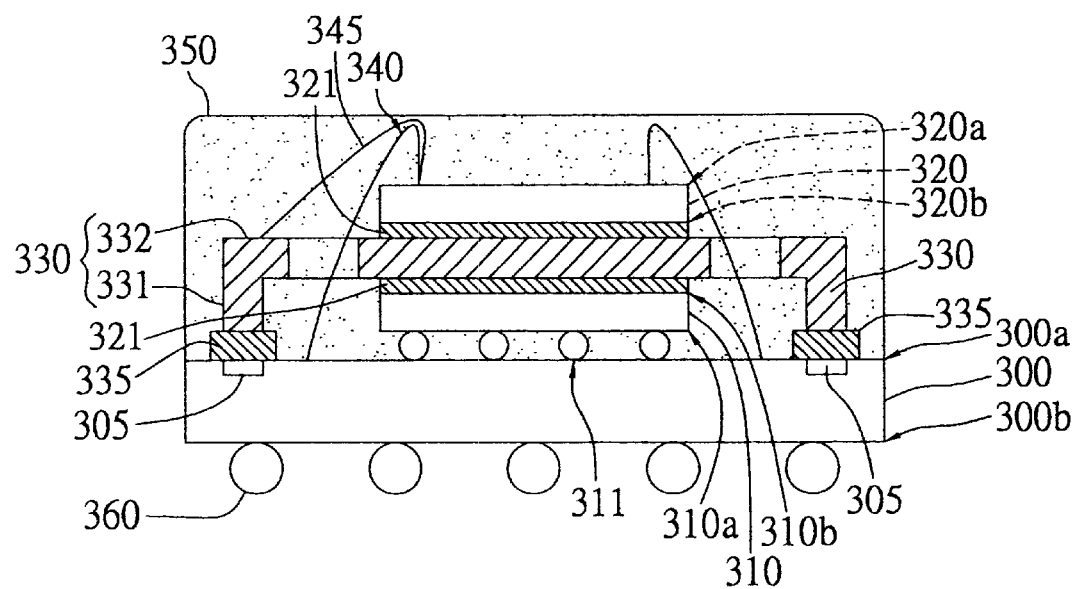
FIG. 6 is a schematic sectional diagram showing a third preferred embodiment of the semiconductor packaging technology according to the invention.

FIG. 6 shows a third preferred embodiment of the semiconductor packaging technology according to the invention.

In this embodiment, an electrically-conductive wire, such as gold wire 345, is bonded from the grounding pad (not shown) of the second semiconductor chip 320 to the overhead portion 332 of the heat spreader 330. This allows an enhanced grounding effect to the second semiconductor chip 320.

Fourth Preferred Embodiment

Figure 7:
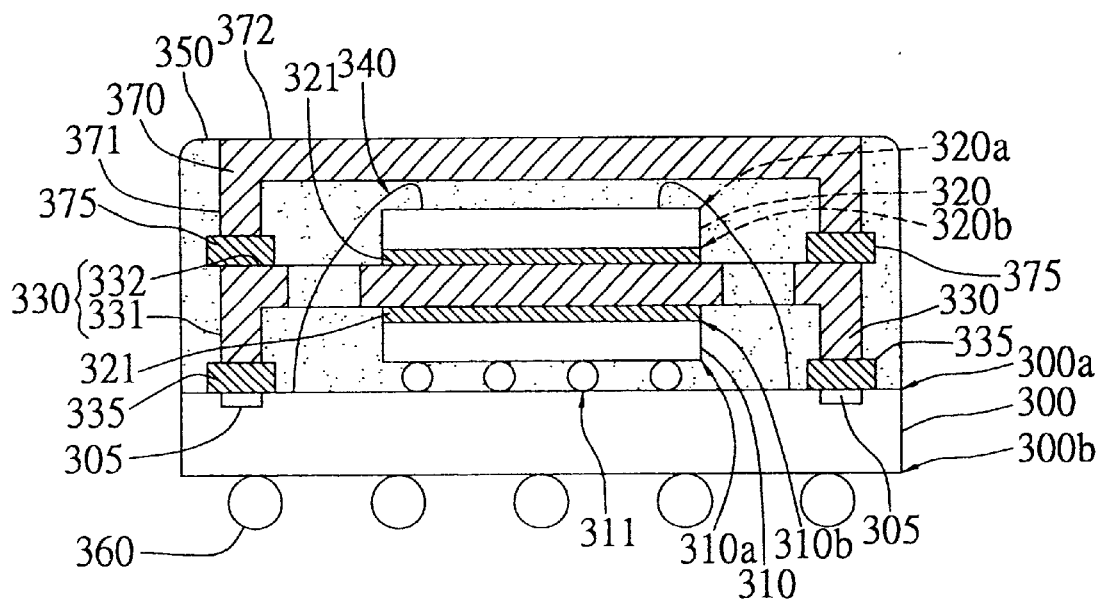
FIG. 7 is a schematic sectional diagram showing a fourth preferred embodiment of the semiconductor packaging technology according to the invention.

FIG. 7 shows a fourth preferred embodiment of the semiconductor packaging technology according to the invention. In this embodiment, an exposed heat spreader 370 is mounted on top of the heat spreader 330, which is made of a thermally-conductive material, such as copper, and which is structured substantially in the same shape as the heat spreader 330, having likewise a support portion 371 and an overhead portion 372. The exposed heat spreader 370 has its support portion 371 adhered by means of a thermally-conductive adhesive layer 375 to the overhead portion 332 of the heat spreader 330, and has its overhead portion 372 exposed to the outside of the encapsulation body 350. This allows an enhanced heat-dissipation performance to the semiconductor package.

Fifth Preferred Embodiment

Figure 8:
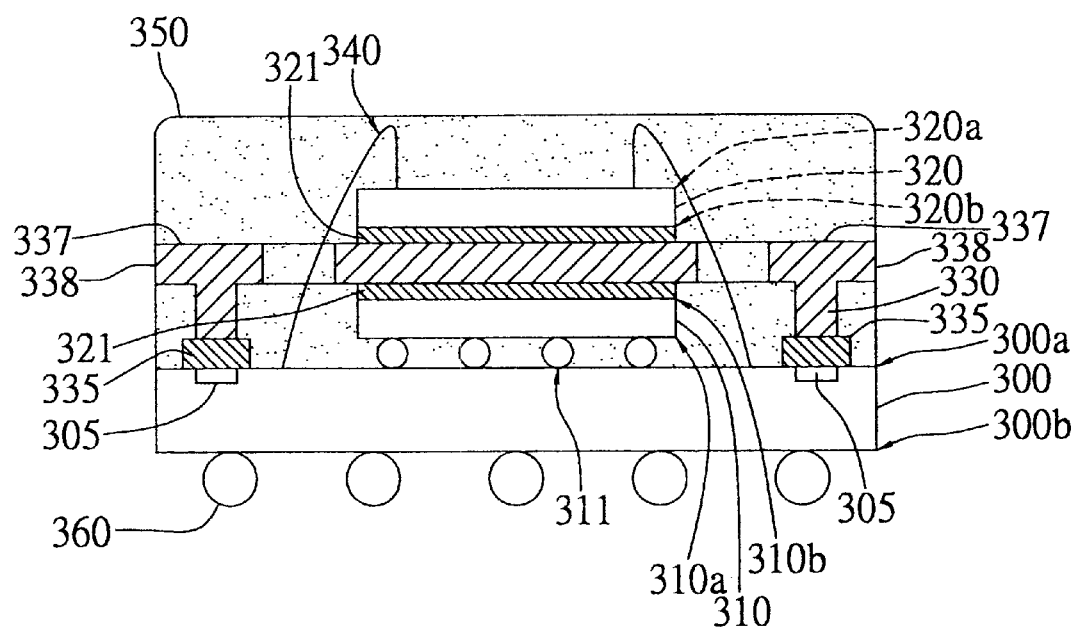
FIG. 8 is a schematic sectional diagram showing a fifth preferred embodiment of the semiconductor packaging technology according to the invention.

FIG. 8 shows a fifth preferred embodiment of the semiconductor packaging technology according to the invention. In this embodiment, the heat spreader 330 is further formed with a sideward-extending portion 337 having an end portion 338 exposed to the outside of the encapsulation body 350. This allows an even more enhanced heat-dissipation performance to the semiconductor package.

Conclusion

Figure 1:
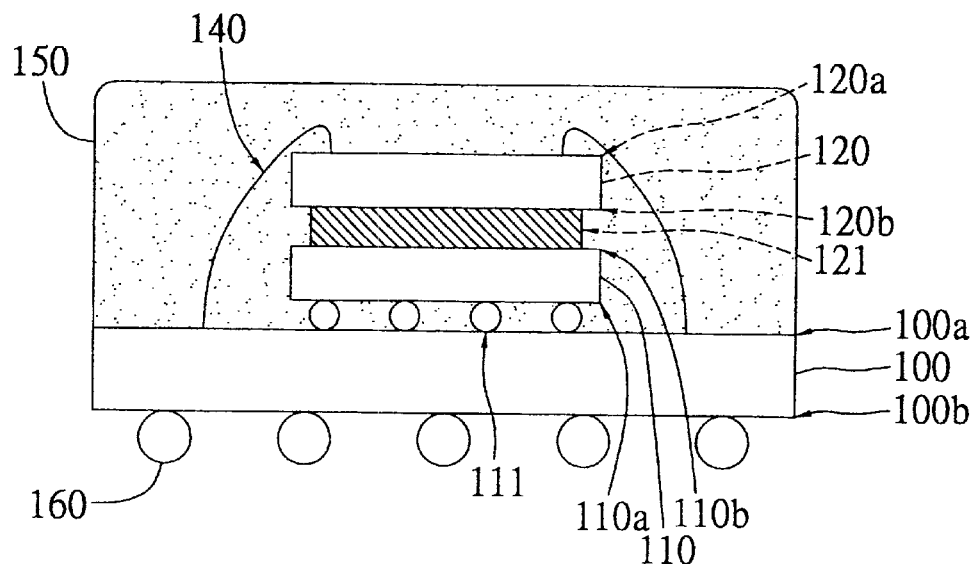
FIG. 1 (PRIOR ART) shows a schematic sectional diagram of a conventional stacked-die BGA package.
Figure 2:
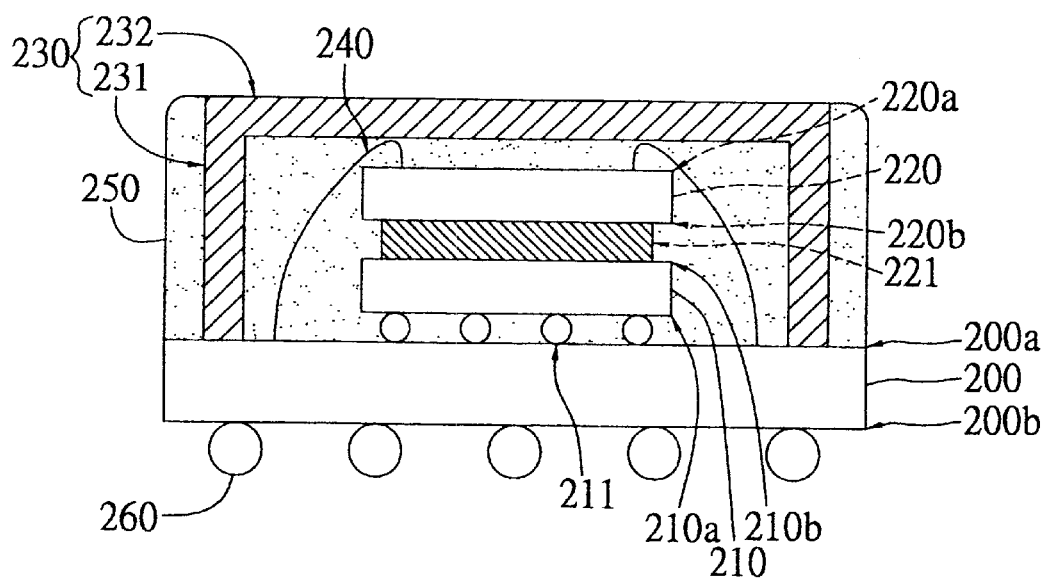
FIG. 2 (PRIOR ART) shows a schematic sectional diagram of a thermally-enhanced version of the stacked-die BGA package of FIG. 1.

In conclusion, the invention provides a new semiconductor packaging technology for the fabrication of a stacked-die BGA semiconductor package. Compared to the prior art, the invention has the following advantages. First, since the heat spreader 330 is in direct contact with both of the two packaged semiconductor chips 310, 320, it allows an increased heat-dissipation capability as compared to the prior art of FIG. 2. Second, since the overhead portion 332 of the heat spreader 330 is arranged between the two packaged chips 310, 320 rather than above the overlying chip 320, it provides a grounding plane to the package chips, so that the packaged chips would have better electrical performance during operation. The invention is therefore more advantageous to use than the prior art.

The invention has been described using exemplary preferred embodiments. However, it is to be understood that the scope of the invention is not limited to the disclosed embodiments. On the contrary, it is intended to cover various modifications and similar arrangements. For example, the sideward-extending portion 337 can be positioned anywhere in the heat spreader 330 or on the exposed heat spreader 370. The scope of the claims, therefore, should be accorded the broadest interpretation so as to encompass all such modifications and similar arrangements.

What is claimed is:

1. A method for fabricating a thermally-enhanced stacked-die BGA semiconductor package, comprising the steps of:

(1) preparing a substrate having a front surface and a back surface;

(2) mounting a first semiconductor chip having an active surface and an inactive surface over the substrate, wherein the active surface of the first semiconductor chip is bonded and electrically coupled to the front surface of the substrate through flip-chip technology;

(3) mounting a heat spreader over the first semiconductor chip, the heat spreader having a support portion and an overhead portion formed with a plurality of wire-routing openings, the heat spreader being mounted in such a manner that the support portion is supported on the front surface of the substrate, while the overhead portion is abutted on the inactive surface of the first semiconductor chip;

(4) mounting a second semiconductor chip having an active surface and an inactive surface over the overhead portion of the heat spreader, wherein the inactive surface of the second semiconductor chip is thermally coupled to the overhead portion of the heat spreader;

(5) providing a plurality of bonding wires for electrically coupling the second semiconductor chip to the substrate, wherein the bonding wires are routed from the active surface of the second semiconductor chip through die wire-routing openings in the overhead portion of the heat spreader down to the front surface of the substrate;

(6) performing an encapsulation process to form an encapsulation body for encapsulating the front surface of the substrate, the first semiconductor chip, the heat spreader, the second semiconductor chip, and the bonding wires; and (7) performing a ball-implantation process to implant an array of solder balls over the back surface of the substrate.

2. The method of claim 1, wherein in said step (3), the heat spreader is made of copper.

3. The method of claim 1, wherein in said step (5), the bonding wires are gold wires.

4. The method of claim 1, wherein the overhead portion of the heat spreader is adhered by means of an electrically-and-thermally-conductive adhesive layer to the inactive surface of the first semiconductor chip.

5. The method of claim 1, wherein the inactive surface of the second semiconductor chip is adhered by means of an electrically-and-thermally-conductive adhesive layer to the overhead portion of the heat spreader.

6. The method claim 1, wherein the support portion of the heat spreader is adhered by means of an electrically-conductive adhesive layer to a ground pad on the front surface of the substrate.

7. The method of claim 1, wherein the ground pad on the second semiconductor chip is bonded by means of a grounding wire to the overhead portion of the heat spreader.

8. The method of claim 1, wherein the overhead portion of the heat spreader is further coupled to a heat spreader having an exposed surface.

9. The method of claim 1, wherein the heat spreader is further formed with a sideward-extending portion having an end portion exposed to the outside of the encapsulation body.

* * * * *